US006543021B1

(12) United States Patent
Piret

(10) Patent No.: US 6,543,021 B1
(45) Date of Patent: Apr. 1, 2003

(54) METHOD AND DEVICE FOR CODING AND TRANSMISSION USING A SUB-CODE OF A PRODUCT CODE

(75) Inventor: Philippe Piret, Cesson-Sevigne (FR)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/353,155

(22) Filed: Jul. 14, 1999

(30) Foreign Application Priority Data

Jul. 16, 1998 (FR) ............................................. 98 09100

(51) Int. Cl.⁷ .................... H03M 13/00; H03M 13/03
(52) U.S. Cl. .................... 714/752; 714/780; 714/758
(58) Field of Search ............................... 714/755, 752, 714/789, 792, 796, 780, 804

(56) References Cited

U.S. PATENT DOCUMENTS 4,435,807 A * 3/1984 Scott et al. ................. 714/804
6,161,209 A * 12/2000 Moher ........................ 375/262

OTHER PUBLICATIONS

"A Two Dimensional Product Code with Robust Soft Decision Decoding" by Freeman et al. IEEE transactions on Communications pp. 1222–1226 Oct. 1996.*

J. Lacan, "Diagonals of 2D–Abelian Codes", 1998 Information Theory Workshop, Jun. 22–24, 1998, pp. 110–111.

R. Lucas et al., "On Iterative Soft–Decision Decoding of Linear Binary Block Codes and Product Codes", IEEE Journal on Selected Areas in Comm., vol. 16, No. 2, 1998, pp. 276–296.

* cited by examiner

Primary Examiner—Albert Decady
Assistant Examiner—Cynthia Britt
(74) Attorney, Agent, or Firm—Fitzpatrick, Cella, Harper & Scinto

(57) ABSTRACT

A method is provided for coding information representing a physical quantity and represented by first binary symbols, having an operation of calculating second binary symbols from the information, the second binary symbols being called calculated binary symbols and being provided in order to be disposed in a square table. For each calculated binary symbol, there exist at least three distinct diagonals in the table which contain this calculated binary symbol and which, deprived of this calculated binary symbol, still allow each one on its own to recalculate the calculated binary symbol. A coding device, a decoding method, a decoding device, a transmission method, and a transmission device are provided, as well as a camera, a facsimile machine, photographic apparatus, and a computer, implementing the invention.

25 Claims, 4 Drawing Sheets

METHOD AND DEVICE FOR CODING AND TRANSMISSION USING A SUB-CODE OF A PRODUCT CODE

BACKGROUND OF THE INVENTION

1. Field of the Invention

The present invention concerns a method and a device for coding and transmission using a sub-code of a product code.

The object of the present invention is to combat errors appearing during the transmission of information, notably within the context of wireless transmission. This is because the transmitted signals, notably those of an electrical nature, are disrupted by noise.

2. Description of the Related Art

A message is defined as being a digital sequence.

One solution consists of making the message redundant, that is to say adding redundancy into the message: in other words, in addition to the symbols representing the information, symbols are transmitted which are functions of the said symbols representing the information.

A device which produces a sequence in an alphabet is called a coder.

A set of sequences produced by the coder is called a code.

To specify a code, or to specify the way of calculating the redundancy to be appended to an item of information, use is often made of matrices. For example, if it is wished to append redundant symbols ($v_4$, $v_5$, $v_6$) (the number of redundant symbols is three in this example) to k binary information symbols ($v_0$, $v_1$, $v_2$, $v_3$) (the number of binary information symbols is denoted k and is equal to four in this example), in order to form the word $v=(v_0, \ldots, v_6)$ of length n (n is equal to seven in this example), a matrix H with n columns and n−k rows (three in this example) in the alphabet $\{0, 1\}$ is produced, such that for example $$H = \begin{vmatrix} 1 & 1 & 1 & 0 & 1 & 0 & 0 \\ 0 & 1 & 1 & 1 & 0 & 1 & 0 \\ 1 & 1 & 0 & 1 & 0 & 0 & 1 \end{vmatrix},$$

and the binary word v of length seven is made to satisfy the equation $v_i * H^r = 0$, where "*" designates the matrix product, where $H^r$ designates the transposed matrix of the matrix H and where the additions are performed modulo 2: the word v is then said to be orthogonal to the matrix H. In this example, the redundant symbols $v_4$, $v_5$ and $v_6$ are therefore calculated as follows;

$v_4 = v_0 + v_1 + v_2$ $v_5 = v_1 + v_2 + v_3$ $v_6 = v_0 + v_1 + v_3$.

The parameter n is called the code length and the parameter k, which is always strictly less than the parameter n, is called the code dimension. The matrix H used in this way is called the parity control matrix or parity matrix.

It is well known that this coding method makes it possible to correct one error: if, after having sent the binary word v on a noisy channel, the binary word $r=(r_0, \ldots, r_6)$ is received where, for at most one index i, one of the symbols $r_i$ is different from the symbol $v_i$, the correction of this error is possible (see Peterson and Weldon, *"Error-Correcting Codes"* MIT Press). More generally, for a fairly large parameter n, more efficient codes can be obtained by increasing the value of the parameter n−k. Such codes make it possible to correct more than one erroneously received symbol. A tool of choice in the implementation of such codes, referred to as linear codes, is then the syndrome $s=r*H^r$ corresponding to the received word r (cf. the Peterson and Weldon reference cited above).

With the aim of improving the transmission performance by means of a coding allowing error correction, without increasing the complexity of its implementation "too much", the product code idea is resorted to: a message to be transmitted which has k*k symbols constituting the information is considered. These symbols are disposed at the top left in a square table of dimension n*n: the first k places of the first k rows of the table have thus been filled, counting the places in the rows from the left and counting the rows in the table from the top. The other n−k places in each row of the table are filled by redundant symbols which depend only on the first k symbols in the row in question: the first k rows of the table or in other words the first k places of each column have thus been entirely filled, counting the places in the columns from the top. The other n−k places in each column of the table are filled by redundant symbols which depend only on the first k symbols in the column in question: the table has thus been entirely filled.

In order to decode a message which comes in the form of a product code, a start can be made by decoding the rows, and the corrections made, if necessary. Then, with the corrected data, the columns are decoded and the corrections made. The method can thus be iterated.

A hard iterative decoding method based on hard demodulation is considered in the article "Diagonals of 2D-Abelian codes" by J. Lacan, published in the proceedings of the 1998 Information Theory Workshop, pp 110–111.

Another improvement of the transmission performance is possible by resorting to a so-called soft decision demodulation method. With this method, a received symbol, denoted rand corresponding to a symbol sent in the alphabet $\{0, 1\}$, is no longer interpreted as an element of this alphabet $\{0, 1\}$. The information ℑ, provided by the symbol r and which can be used by a decoder, is then expressed by the formula ℑ=log[f(r)] where log designates the logarithm of its argument in a base strictly greater than 1, and where f(r) is the ratio between the likelihood of receiving a value close to r when 1 is sent and that of receiving a value close to r when 0 is sent. This logarithm is called the log-likelihood-ratio (l.l.r.).

When such a soft decision can be made, the decoding of product codes proves to be particularly efficient (see on this subject: J. Hagenauer, E. Offer and L Papke, *"Iterative decoding of binary block and convolutional codes"*, IEEE Transactions on Theory, vol. 42, pp 429–445, March 1996 and R. Pyndiah, A. Glavieux, A. Picart and S. Jacq, *"Near optimum decoding of product codes"*, Proceedings IEEE Globecom Conference, pp 339–343, San Francisco, November 1994). The theoretical ideas at the basis of these articles date back to the book by R. G. Gallager, *"Low-density parity-check codes"*, published by MIT Press in 1963, but the above articles succeed in specifying how to implement these theoretical bases efficiently.

In practice, the letters of the alphabet $\{0, 1\}$ are transmitted on the channel by two different electrical signals and identified with the numbers +1 (for the letter 0) and −1 (for the letter 1). As long as the electrical signals chosen in this way are "reasonable" and the noise affecting the channel not too different from the conventional Additive White Gaussian Noise, better known by the initials AWGN, the situation of such a channel is well known and commonly studied.

To illustrate the usage of the ideas introduced above, this particular simple example is considered. The control matrix H=[1 1 1] defines a code (n=3, k=2) in the alphabet {0, 1}. By applying the construction mentioned above of product code of this code by itself, four binary symbols $v_{0,0}, v_{0,1}, v_{1,0}$ and $v_{1,1}$, can be used to construct the binary word v of length 9 represented by this particular 3*3 matrix:

$$v = \begin{matrix} v_{0,0} & v_{0,1} & v_{0,2} \\ v_{1,0} & v_{1,1} & v_{1,2} \\ v_{2,0} & v_{2,1} & v_{2,2} \end{matrix},$$

where the symbols $v_{2,0}, v_{2,1}, v_{2,2}, v_{0,2}$ and $v_{1,2}$ have been calculated so that the three rows and the three columns of the word v are orthogonal to the matrix H.

By virtue of the parity relationships imposed by the matrix H on these symbols $v_{i,j}$, it may be concluded that $v_{1,1}$ (for example) satisfies the equations:

$$v_{1,1} = v_{0,1} + v_{1,2} \quad (1)$$

$$v_{1,1} = v_{0,1} + v_{2,1} \quad (2)$$

where the additions are performed modulo 2. After transmission of a symbol $v_{ij}$ on the channel, a calculation can be performed, for the received symbol $r_{ij}$ which corresponds to it, of the log-likelihood-ratio $\mathfrak{I}_{ij} = [\log f(r_{ij})]$, and the matrix $\mathfrak{I}$ of these values $\mathfrak{I}_{i,j}$ can be constructed:

$$\mathfrak{I} = \begin{matrix} \mathfrak{I}_{0,0} & \mathfrak{I}_{0,1} & \mathfrak{I}_{0,2} \\ \mathfrak{I}_{1,0} & \mathfrak{I}_{1,1} & \mathfrak{I}_{1,2} \\ \mathfrak{I}_{2,0} & \mathfrak{I}_{2,1} & \mathfrak{I}_{2,2} \end{matrix}$$

The equations (1) and (2) above express the fact that the symbol $v_{1,1}$ (for example) can be estimated from three sets of values $\mathfrak{I}_{ij}$ independent from one another. The first such set is the set $\{\mathfrak{I}_{1,1}\}$, the second is the set $\{\mathfrak{I}_{1,0}, \mathfrak{I}_{1,2}\}$ by virtue of the equation (1) and the third is the set $\{\mathfrak{I}_{0,1}, \mathfrak{I}_{2,1}\}$ by virtue of the equation (2). More generally, whatever the coordinates s and t, there are, for estimating the symbol $v_{s,t}$, three sets of values $\mathfrak{I}_{i,j}$, the first of which is the singleton $\{\mathfrak{I}_{s,t}\}$, and the other two of which each contain two elements. The use of these independent sets of $\mathfrak{I}_{i,j}$ for estimating the symbols $v_{s,t}$ of the transmitted word v on the basis of the received symbols $r_{i,j}$ and the corresponding table of values $\mathfrak{I}_{i,j}$ can be understood by referring for example to J. Hagenauer et al. (reference given above). A general case is considered here where the parameter n can be greater than or equal to three and the parameter k can be greater than or equal to two. However, for any pair of coordinates (s,t) of a symbol $v_{s,t}$, only three sets of values $\mathfrak{I}_{i,j}$ are to be taken into consideration, namely the set $\{\mathfrak{I}_{s,t}\}$, the set $\{\mathfrak{I}_{s,u}$ for u different from t} and the set $\{\mathfrak{I}_{u,t}$ for u different from s}.

In this context, the iterative correction of a received word r can be performed as follows.

In a first step, for any pair of coordinates (s, t), the element $\mathfrak{I}_{s,t}$ of the matrix $\mathfrak{I}$ and the set $\{\mathfrak{I}_{s,u}$ for u different from t} are considered. This makes it possible to calculate from these data, for any pair of coordinates (s, t), a new log-likelihood-ratio denoted $V_{s,t}$.

In a second step, for any pair of coordinates (s, t), the element $\mathfrak{I}_{s,t}$ of the matrix $\mathfrak{I}$, the element $V_{s,t}$ which has just been calculated and the set $\{\mathfrak{I}_{u,t}$ for u different from s} are considered. After having set $K_{s,t} = V_{s,t}$, a new log-likelihood-ratio again denoted $V_{s,t}$ can then be calculated for any pair of coordinates (s, t).

In a third step, for any pair of coordinates (s, t), the element $\mathfrak{I}_{s,t}$ of the matrix $\mathfrak{I}$, the element $V_{s,t}$ which has just been calculated and the set $\{\mathfrak{I}_{s,u}$ for u different from t} are considered. After having set $K_{s,t} = V_{s,t}$, a new log-likelihood-ratio again denoted $V_{s,t}$ an then be calculated for any pair of coordinates (s, t).

The procedure is then continued by performing the second and third steps alternately When the number of steps chosen beforehand has been performed, three matrices containing log-likelihood-ratios are available. The first is the matrix $\mathfrak{I}$, the second is the matrix $V$ having the element $V_{s,t}$ in coordinate position (s, t) and the third is the matrix K having the element $K_{s,t}$ in coordinate position (s, t).

The matrix $D = \mathfrak{I} + V + K$ is then calculated and the following are used for the decoding: if $D_{i,j}$ is positive, the estimate $v_{i,j} = 1$ is used, and if $D_{i,j}$ is negative, the estimate $v_{i,j} = 0$ is used. Furthermore, the absolute value of $D_{i,j}$ expresses the degree of confidence which can be given to this decision.

The J. Hagenauer et al. reference given above will advantageously be consulted on this subject.

The context of product codes is, as has been seen, particularly adapted to iterative correction. The words of such a code C are easily represented by means of a rectangular table with $N_h$ columns and $N_v$ rows, where each row (respectively each column) is a word of a code $C_h$ (respectively $C_v$) of length $N_h$ (respectively $N_v$). A word of the code C of length $N_h * N_v$ is thus represented by the matrix:

$$v = \begin{matrix} v_{0,0} & v_{0,1} & \ldots & v_{0,Nh-1} \\ v_{1,0} & v_{1,1} & \ldots & v_{1,Nh-1} \\ \ldots & \ldots & \ldots & \ldots \\ v_{Nv-1,0} & v_{Nv-1,1} & \ldots & v_{Nv-1,Nh-1} \end{matrix} \quad (3)$$

where each $v_{i,j}$ is a binary symbol intended to be transmitted.

After transmission of the word v by the channel, a word r is received:

$$r = \begin{matrix} r_{0,0} & r_{0,1} & \ldots & r_{0,Nh-1} \\ r_{1,0} & r_{1,1} & \ldots & r_{1,Nh-1} \\ \ldots & \ldots & \ldots & \ldots \\ r_{Nv-1,0} & r_{Nv-1,1} & \ldots & r_{Nv-1,Nh-1} \end{matrix} \quad (4)$$

from which the matrix $\mathfrak{I}$ of the elements $\mathfrak{I}_{i,j} = \log[f(r_{i,j})]$ can therefore be calculated.

SUMMARY OF THE INVENTION

The aim of the present invention is to improve the efficiency of the transmission, of the correction and of the decoding by explicitly implementing coding methods using codes for which it is possible to obtain more than three independent sets of symbols providing information on any one of the symbols of the word v.

The codes to be used in the present invention are not however usual product codes. They are more precisely codes contained in these usual product codes, that is to say sub-codes of these usual product codes. An attempt is made to obtain a code which makes it possible to obtain more than three independent estimates for each transmitted symbol. It will be made certain that redundancies exist not only on the rows and the columns, but also on the diagonals with certain gradients.

The present invention is concerned with the turbodecoding of these codes, i.e. with an iterative decoding that uses soft information at each step.

To this end, according to a first aspect, the present invention relates to a method of transmitting information representing a physical quantity and represented by first binary symbols, having:
- a coding operation comprising an operation of calculating second binary symbols, referred to as calculated binary symbols, from the said information, the said calculated binary symbols being provided in order to be disposed in a square table,
- an operation of transferring the said calculated symbols, comprising an operation of modulating the said calculated symbols and an operation of demodulating the modulated symbols into symbols referred to as received symbols,
- an operation of correcting the said received symbols providing binary symbols referred to as corrected symbols, and
- an operation of decoding the information from the said corrected symbols,
characterised in that, for each said calculated binary symbol, there exist at least three distinct diagonals in the table which contain this calculated binary symbol and which, deprived of this calculated binary symbol, still allow each one on its own to recalculate the said calculated binary symbol,
the demodulating operation in performed by a soft decision method, and
the correcting operation is performed iteratively with respect to each of the distinct diagonals.

In a preferred embodiment, the present invention also relates to a method such as exposed briefly above, characterised in that the calculating operation comprises:
- an operation of defining a plurality of bivariable polynomials representing the first binary symbols as their coefficients, and
- an operation of calculating the calculated binary symbols in the form of coefficients of a polynomial obtained as a sum of products of each one of the defined polynomials and a respective one of a plurality of predetermined basis polynomials which form a basis of the set of all bivariable polynomials.

In the sense of the present invention, a row and a column of a matrix are special diagonals. Such a method makes it possible to have available at least three independent sources of data on the calculated binary symbol, besides the calculated binary symbol itself. By means of this coding method, the redundancy of the coded message is increased judiciously and without excess. In this way, the performance of the correction and of the decoding and therefore of the transmission are improved, by making error correction possible without increasing too much either the redundancy, or the complexity of implementation of the coding and decoding.

This is because, as mentioned in J. Hagenauer et al. (reference given above) the quantities $(V)_{s,t}$ and $(K)_{s,t}$ introduced above become more and more correlated at each iteration.

According to the invention, it is worthwhile, notably for remedying this drawback, to have available more than three disjoint sets of values $\mathfrak{S}_{i,j}$ for estimating each of the symbols $v_{s,t}$.

This is because, at the third step mentioned above, use has been made again of the step $\{\mathfrak{S}_{s,u}$ for u different from t$\}$ which had already been used at the first step. If, besides the value $\mathfrak{S}_{s,u}$ the set $\{\mathfrak{S}_{s,u}$ for u different from t$\}$ and the set $\{\mathfrak{S}_{u,t}$ for u different from s$\}$, other sets were available, disjoint from these first three, disjoint in pairs and providing information on the symbol $v_{s,t}$, the first of them could for example be used at the third step, the second of them at the fourth step and so on. If, therefore, for any pair of coordinates (s,t) there are available, besides the value $\mathfrak{S}_{s,t}$, $\lambda$ such disjoint sets of values $\mathfrak{S}_{i,j}$, not containing the value $\mathfrak{S}_{s,t}$ but each making it possible to correctly estimate the symbol $v_{s,t}$ in the absence of noise, $\lambda$ steps can be performed, in the iterative correction procedure briefly outlined above, before having to use one of these $\lambda$ sets a second time. At each of these steps, it is then necessary to store, for any coordinate s and for any coordinate t, not only the last value $V_{s,t}$ calculated, but also the last $\lambda-1$.

When the number of steps chosen beforehand has been performed, there are then available $\lambda+1$ matrices containing logarithms of likelihood-ratios. The first is the matrix $\mathfrak{S}$ and the $\lambda$ others are the last $\lambda$ matrices $V$ produced by the algorithm. The matrix $D$ is then calculated as being the sum of these $\lambda+1$ matrices and it is used as indicated above.

It should also be noted that if, besides the symbol $r_{s,t}$ itself, there are available at least three disjoint sets of values $\mathfrak{S}_{i,j}$ for estimating each symbol $v_{s,t}$, the solution to the well known problem of rectangular error configurations mentioned in column 2 of page 441 in the above-mentioned article by J. Hagenauer et al. is improved.

In a preferred embodiment of the transmission method, the decoding operation comprises:
- an operation of calculating product polynomials by multiplying a polynomial representing the corrected symbols and each of the predetermined polynomials,
- an operation of estimating the first binary symbols as the coefficients of the defined polynomials on the basis of specific coefficients of the product polynomials, and
- an operation of outputting the estimated coefficients as the decoded information.

In a preferred embodiment of the transmission method, the correcting operation determines a respective log-likelihood-ratio and the corected symbols are estimated on the basis of a sum of the respective log-likelihood-ratios.

In a preferred embodiment, for the transmission method, during the calculation operation, there exists an Abelian code such that, for any information, the table of calculated binary symbols is a word of the said Abelian code.

The advantage of using an Abelian code comes from the fact that efficient calculation tools are available, provided by the theory of Abelian codes, for effectively specifying these codes and the corresponding coders. This theory is notably studied by P. Delsarte, in "*Automorphisms of Abelian codes*", Philips Research Reports, vol. 25, pp 389–403, 1970 and by H. Imai, "*A theory of two-dimensional cyclic codes*", Information and Control, vol. 34, pp 1–21, 1977.

In a preferred embodiment, the transmission method is such that there exists an integer n greater than or equal to two, such that, during the calculation operation, for an element r which is null or infinite or an integer prime with n, each diagonal of gradient r is a word of a BCH code Which means that, for a given value of gradient, each diagonal which has this gradient is a word of a BCH code The BCH codes are notably defined in the Peterson and Weldon book mentioned above.

The advantage of using diagonals which are in a BCH code is twofold. On the one hand, these codes being cyclic, they fit perfectly in the Abelian code structure mentioned above, on the other hand these BCH codes are known as being amongst the best and most practical cyclic codes (see on this subject the book by S. Lin and D. Costello, "*Error Control Coding: Fundamental and Applications*", Prentice-Hall, 1983).

Advantageously, the transmission method can be designed so that there exists an integer m greater than or equal to 2, an integer n equal to $2^m-1$ and an integer k equal to n−m, such that, during the calculation operation, for an element $p_e$ which is null or infinite or an integer prime with the integer n, each diagonal of gradient $p_e$ is a word of a Hamming code of type (n,k).

Which means that, for a given value of gradient, each diagonal which has this gradient is a word of a Hamming code of type (n,k).

The advantage of using a diagonal which is in a Hamming code is twofold. On the one hand the efficiency of a Hamming code is relatively high, which is a favourable element for the efficiency of the overall Abelian code in which this Hamming code is used. On the other hand, the decoding of Hamming codes in a manner adapted to the aim of the present invention is performed quite simply (see the article by Hagenauer et al. mentioned above).

For analogous reasons, advantageously, the transmission method is such that there exists an integer m greater than or equal to 2, an integer n equal to $2^m-1$ and an integer k equal to n−m, such that, during the calculation operation, for at least two elements p and q, with p null or infinite or an integer prime with the integer n and q null or infinite or an integer prime with the integer n, each diagonal of gradient p and each diagonal of gradient q is a word of one and the same Hamming code of type (n,k).

Which means that, for at least two distinct values of gradient, the diagonals of the tables of binary symbols which have these gradients are words of a Hamming code of type (n,k).

This makes it possible to have the advantages of Hamming codes.

Advantageously, the transmission method briefly explained above is such that there exists at least one integer n greater than or equal to two, such that, during the calculation operation, for an element s which is null or infinite or an integer prime with the integer n, each diagonal of gradient s is a word of the parity code of type (n, n−1).

Which means that, for one or more values of gradient, the diagonals which have this gradient are in the parity code of type (n, n−1) defined as being the set of binary words of length n containing an even number of is.

This makes it possible to keep quite a high efficiency in the overall Abelian code without reducing the number of disjoint sets of values $\Im_{i,j}$ used for the decoding of each symbol $v_{s,t}$.

The invention also relates to a device employing a transmission method such as that briefly presented previously.

The invention also relates to a camera, a facsimile machine, photographic apparatus, and a computer, characterised in that they include a device as briefly described above.

The invention also relates to:

an information storage means readable by a computer or a microprocessor storing instructions of a computer program, characterised in that it allows the implementation of the method of the invention briefly described above, and an information storage means readable by a computer or a microprocessor storing data resulting from the implementation of the method briefly described above.

The invention also relates to:

an information storage means which is removable, partially or totally, and readable by a computer or a microprocessor storing instructions of a computer program, characterised in that it allows the implementation of the method of the invention as briefly described above, and an information storage means which is removable, partially or totally, and readable by a computer or a microprocessor storing data resulting from the implementation of the method briefly described above.

The preferential or particular characteristics and the advantages of this transmission method, of these devices, of this camera, of this facsimile machine, of this photographic apparatus, of this computer and of these information storage means being identical to those of the coding method, these advantages are not repeated here.

BRIEF DESCRIPTION OF THE DRAWINGS

The invention will be better understood from a reading of the description which follows, given with reference to the accompanying drawings in which.

DETAILED DESCRIPTION OF THE PREFERRED EMBODIMENTS

Figure 1:
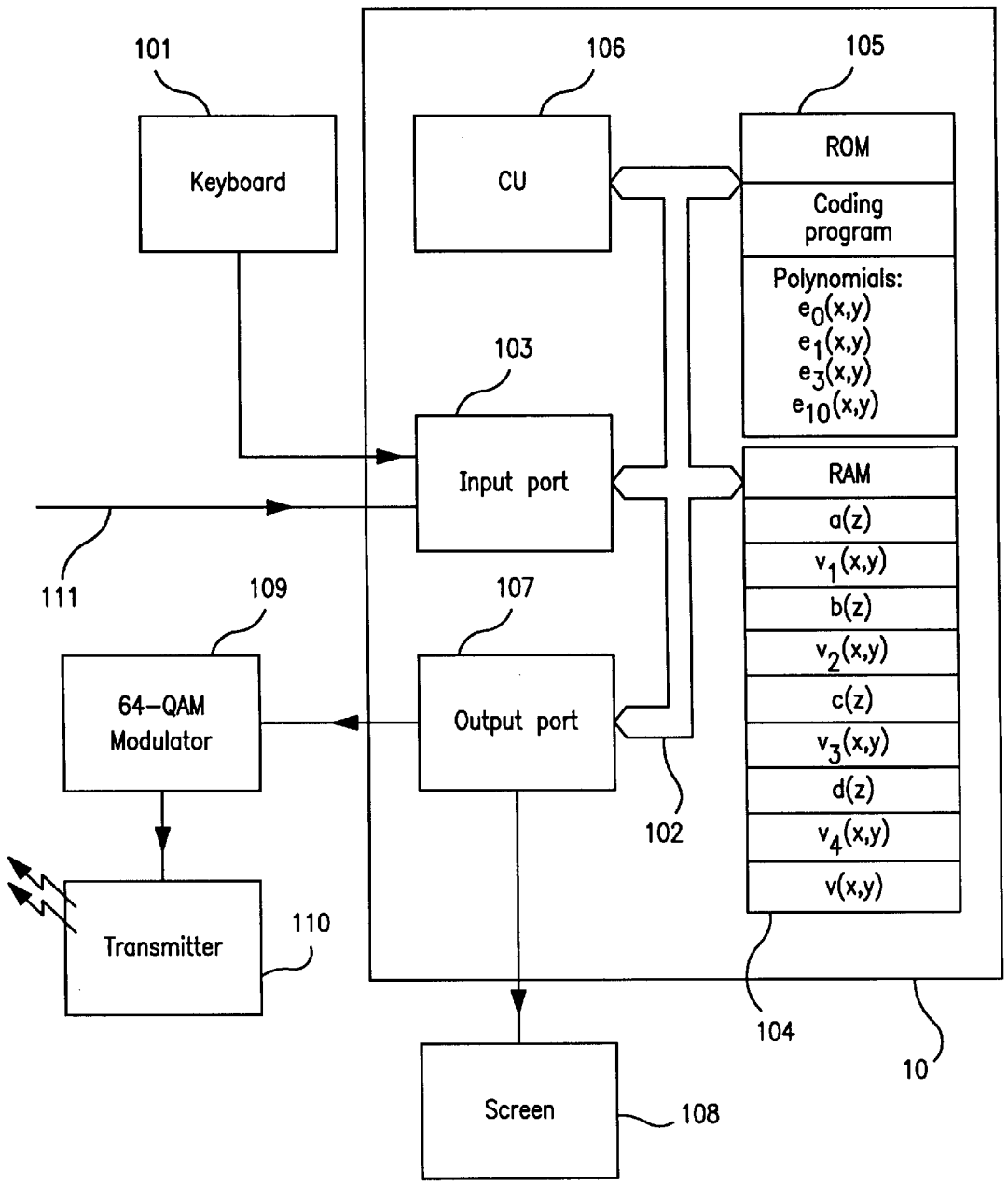
FIG. 1 depicts a coding device according to the present invention.

Before commencing the description of the coding device illustrated in FIG. 1, it is essential to describe the theoretical context.

Two integers $N_v$ and $N_h$ greater than or equal to two will be considered.

The set of bivariable polynomials with binary coefficients of degree at most $N_v-1$ in x and at most $N_h-1$ in y is called E.

In the whole of the following, the multiplication of polynomials of the set E will always be performed modulo the polynomials $x^{N_v}+1$ and $y^{N_h}+1$ and the resulting coefficients will be calculated modulo 2.

Let v be a word of length $N_v*N_h$ taking its values from the alphabet {0, 1} and represented as in the equation (1) by an $N_v*N_h$ rectangular matrix. The polynomial v(x,y) in the set E is associated with it and vice versa:

$$v(x,y) = \Sigma_{i=0 \text{ to } Nv-1 \text{ and } j=0 \text{ to } Nh-1} v_{i,j} x^i y^j.$$

In the whole of the following, the notation v(x,y) will be used to designate the polynomial of the set E associated with an $N_v*N_h$ rectangular matrix v.

The matrix resulting from the cyclic permutation on the matrix v consisting of incrementing each row index by 1 modulo $N_v$ is identical to the matrix associated with the polynomial x*v(x,y).

Likewise, the matrix resulting from the cyclic permutation on the matrix v consisting of incrementing each column index by 1 modulo $N_h$ is identical to the matrix associated with the polynomial y*v(x,y).

A polynomial g(x,y) of the set E and its associated matrix will be considered: the set of polynomials v(x,y) of the set E, generated by the polynomial g(x,y), such that there exists a polynomial a(x,y) of the set E such that:

$$v(x,y)=a(x,y)*g(x,y)$$

is called an ideal, denoted J(g(xy)).

Let J be an ideal of the set E, a polynomial g(x,y) is said to be a generator of the ideal J if, for any polynomial v(x,y) of the ideal J, these exists a polynomial a(x,y) of E such that:

$$v(x,y)=a(x,y)*g(x,y).$$

The ideal generated by the null polynomial is called the trivial ideal.

An ideal is said to be minimal if it is not trivial and contains no ideal other than itself and the trivial ideal.

A polynomial g(x,y) of the set E is said to be idempotent if:

$$g(x,y)+g(x,y)=g(x,y).$$

It can be demonstrated that the cardinal of any ideal of the set E is a power of two and this power of two is called the dimension of the ideal.

It can be demonstrated that if the integers $N_h$ and $N_v$ are odd:

any ideal of the set E contains an idempotent generator, any minimal ideal J contains a single non-null and idempotent polynomial g(x,y); this polynomial g(x,y) is a generator for the ideal J and is called an idempotent minimal polynomial, and two different minimal idempotent polynomials $e_1(x,y)$ and $e_2(x,y)$ are always orthogonal: that is to say they satisfy the relationship:

$$e_1(x,y)*e_2(x,y)=0.$$

The case where the integers $N_h$ and $N_v$ are odd will be considered. The set of idempotent minimal polynomials of the set E is called $M=\{e_l(x,y), 0<=l<=L\}$ and it can be demonstrated that any polynomial v(x,y) of the set E is written in the form:

$$v(x,y)=\Sigma_{l=0\ to\ L} v_l(x,y)*e_l(x,y)$$

where the polynomials $v_l(x,y)*e_l(x,y)$ depend only on the polynomial v(x,y). The set M is said to form a basis of the set E.

Tables of more than two dimensions can be dealt with in an analogous manner.

In the case $N_v=N_h$, which is the one which is being considered now, N is set to be: $N=N_v=N_h$. Given then a matrix v of type N*N in the alphabet $\{0, 1\}$ and an integer a prime with N, the i+1$^{th}$ diagonal of gradient a is defined as being, for i integer between 0 and N−1, the vector $(v_{i+0}, v_{j+a,1}, \ldots, v_{i+(N-1)a,N-1})$, where the first index is the index of the element of the row, and the second index is the index of the element of the column in the matrix v. The i+1$^{th}$ row will be said to be the i+1$^{th}$ diagonal of gradient 0. A column will be said to be a diagonal of infinite gradient.

The case where $N_v=N_h=N=7$ is now going to be considered. The notations and conventions of the theoretical context will be used again.

In particular, applying these notations, it can be seen that the set E is an ideal of dimension 49.

$$e_1 = \begin{vmatrix} 1 & 1 & 1 & 1 & 1 & 1 & 1 \\ 1 & 1 & 1 & 1 & 1 & 1 & 1 \\ 1 & 1 & 1 & 1 & 1 & 1 & 1 \\ 0 & 0 & 0 & 0 & 0 & 0 & 0 \\ 1 & 1 & 1 & 1 & 1 & 1 & 1 \\ 0 & 0 & 0 & 0 & 0 & 0 & 0 \\ 0 & 0 & 0 & 0 & 0 & 0 & 0 \end{vmatrix}$$

and let the following functions be introduced $$f(x)=1+x+x+x^4$$

and $$s(x)=1+x+x^2+x^3+x^4+x^5+x^6.$$

Then this gives: $e_1(x,y)=f(x)*s(y)$, $y*e_1(x,y)=e_1(x,y)$, $x*e_1(x,y)$ is different from $e_1(x,y)$.

It can be demonstrated that the dimension of the ideal $J(e_1(x,y))$ is equal to three and likewise for the polynomials $e_l(x,y)$ with the index/between 2 and 16 defined below:

$$e_2(x,y)=f(x^3)*s(y)$$

$$e_3(x,y)=f(y)*s(x)$$

$$e_4(x,y)=f(Y^3)*s(x)$$

$$e_5(x,y)=f(x)*s(x,y)$$

$$e_6(x,y)=f(x)*s(x^2y)$$

$$e_7(x,y)=f(x)*s(x^3y)$$

$$e_8(x,y)=f(x)*s(x^4y)$$

$$e_9(x,y)=f(x)*s(x^5y)$$

$$e_{10}(x,y)=f(x)*s(x^6y)$$

$$e_{11}(x,y)=f(x^3)*s(xy)$$

$$e_{12}(x,y)=f(x)*s(x^2y)$$

$$e_{13}(x,y)=f(x^3)*s(x^3y)$$

$$e_{14}(x,y)=f(x^3)*s(x^4y)$$

$$e_{15}(x,y)=f(x^3)*s(x^5y)$$

$$e_{16}(x,y)=f(x^3)*s(x^6y).$$

It should be noted that $e_3(x,y) = e_1(y,x)$, which is expressed in matrix terms by a transposition of the corresponding matrices.

Also let $e_0(x,y)=s(x)*s(y)$ be defined. It may be verified that $e_0(x,y)$ is idempotent and that for any polynomial a(x,y) of the set E, $a(x,y)*e_0(x,y)$ is equal to either $e_0(x,y)$ or the null polynomial.

Let the set $M=\{e_l(x,y)$ with 1 between 0 and 16$\}$ be introduced; it may be demonstrated that this is the set of idempotent minimal polynomials of the set E. As specified above in the theoretical part, this is a basis of the set E.

Let the matrices $e_5$, $e_9$, and $e_{10}$, associated with the polynomials $e_6(x,y)$ $e_9(x,y)$ and $e_{10}(x,y)$ be specified:

$$e_6 = \begin{vmatrix} 1 & 0 & 0 & 1 & 0 & 1 & 1 \\ 1 & 0 & 1 & 1 & 1 & 0 & 0 \\ 1 & 1 & 0 & 0 & 1 & 0 & 1 \\ 0 & 1 & 0 & 1 & 1 & 1 & 0 \\ 1 & 1 & 1 & 0 & 0 & 1 & 0 \\ 0 & 0 & 1 & 0 & 1 & 1 & 1 \\ 0 & 1 & 1 & 1 & 0 & 0 & 1 \end{vmatrix}$$

$$e_9 = \begin{vmatrix} 1 & 1 & 1 & 0 & 1 & 0 & 0 \\ 1 & 0 & 0 & 1 & 1 & 1 & 0 \\ 1 & 1 & 0 & 1 & 0 & 0 & 1 \\ 0 & 0 & 1 & 1 & 1 & 0 & 1 \\ 1 & 0 & 1 & 0 & 0 & 1 & 1 \\ 0 & 1 & 1 & 1 & 0 & 1 & 0 \\ 0 & 1 & 0 & 0 & 1 & 1 & 1 \end{vmatrix}$$

$$e_{10} = \begin{vmatrix} 1 & 1 & 1 & 0 & 1 & 0 & 0 \\ 1 & 1 & 0 & 1 & 0 & 0 & 1 \\ 1 & 0 & 1 & 0 & 0 & 1 & 1 \\ 0 & 1 & 0 & 0 & 1 & 1 & 1 \\ 1 & 0 & 0 & 1 & 1 & 1 & 0 \\ 0 & 0 & 1 & 1 & 1 & 0 & 1 \\ 0 & 1 & 1 & 1 & 0 & 1 & 0 \end{vmatrix}$$

A binary code of length 49 will now be specified, by imposing certain restrictions on the components $v_l(x,y)*e_l(x,y)$ of the words $v(x,y) = \Sigma_{l=0 \text{ to } N-1} v_l(x,y)*e_l(x,y)$ of this code.

For this let the matrices G and H be considered:

$$G = \begin{vmatrix} 1 & 1 & 1 & 0 & 1 & 0 & 0 \\ 0 & 1 & 1 & 1 & 0 & 1 & 0 \\ 0 & 0 & 1 & 1 & 1 & 0 & 1 \\ 1 & 1 & 1 & 1 & 1 & 1 & 1 \end{vmatrix}$$

$$H = \begin{vmatrix} 1 & 1 & 1 & 0 & 1 & 0 & 0 \\ 0 & 1 & 1 & 1 & 0 & 1 & 0 \\ 1 & 1 & 0 & 1 & 0 & 0 & 1 \end{vmatrix}.$$

The code B is defined by saying that a seven-tuple, u, of elements of the set {0, 1} is in the code B if it is a linear combination of the row vectors of the matrix G taken modulo two. It is equivalent to saying that a seven-tuple, u, of elements of the set {0, 1} is in the code B if this seven-tuple verifies:

$$u*H^t = 0.$$

B is traditionally called the (7, 4) Hamming code.

The (7, 6) parity code, denoted $B_0$, is defined by saying that a seven-tuple of elements of the set {0,1} is in the code $B_0$ if the sum of the elements of the seven-tuple taken modulo two is equal to zero.

Let a be an integer prime with 7. It is clear that if all the diagonals of gradient a of a matrix $e_i$ are words of the code B (respectively $B_0$), then it is likewise for all matrices obtained from the matrix e, by cyclic permutation of the columns and/or rows and it is likewise for any linear combination of these matrices and, consequently, it is likewise for any matrix associated with a polynomial $v(x,y)$ of the form $v(x,y) = a(x,y)*e_i(x,y)$ where $a(x,y)$ is an arbitrary polynomial of E.

The following proposition can be demonstrated: a matrix, denoted v, has all its columns in the code B (respectively $B_0$) if and only if the polynomial $v(x,y)$ associated with the matrix v uses in its factorization on the basis M only polynomials $e_i(xJy)$ of the basis M of which the corresponding matrices have all their columns in the code B (respectively $B_0$).

Likewise, the following proposition can be demonstrated: a matrix, denoted v, has all its rows in the code B (respectively $B_0$) if and only if the polynomial $v(x,y)$ associated with the matrix v uses in its factorization on the basis M only polynomials of the matrix M of which the corresponding matrices have all their rows in the code B (respectively $B_0$).

Let a be an integer prime with 7; the following proposition can be demonstrated: a matrix, denoted v, has all its diagonals of gradient a in the code B (respectively $B_0$) if and only if the polynomial $v(x,y)$ associated with the matrix v uses in its factorization on the basis M only polynomials of M of which the corresponding matrices have all their diagonals of gradient a in the code B (respectively $B_0$).

A 7*7 square matrix is said to verify the property $P_1$ if all its columns, all its rows and all its diagonals of gradient 1 are in the code B.

By examining the matrices associated with the polynomials of basis M, it is established that there are four matrices of the basis M which verify the property $P_1$ namely $e_0$, $e_1$, $e_3$, and $e_{10}$. It can be demonstrated that the set of matrices verifying the property $P_1$ is an ideal of dimension 10. The matrix $e_0$ contributes to one unit of dimension and the matrices $e_1$, $e_3$ and $e_{10}$ each contribute to three units of dimension.

A 7*7 square matrix is said to verify the property $P_2$ if all its columns and all its rows are in the code B and if all its diagonals of gradient 1 are in the code $B_0$.

By examining the matrices associated with the polynomials of basis M, it is established that there are five matrices of the basis M which verify the property $P_2$ namely $e_1$, $e_3$, $e_7$, $e_9$ and $e_{10}$. It can be demonstrated that the set of matrices verifying the property $P_2$ is an ideal of dimension 15. Each of the preceding matrices contributes to three units of dimension A 7*7 square matrix is said to verify the property $P_3$ if all its rows are in the code B and if all its columns and all its diagonals of gradient 1 are in the code $B_0$.

By examining the matrices associated with the polynomials of basis M, it is established that there are seven matrices of the basis M which verify the property $P_3$ namely $e_1$, $e_2$, $e_7$, $e_9$, $e_{10}$, $e_{12}$ and $e_{14}$. It can be demonstrated that the set of matrices verifying the property $P_3$ is an ideal of dimension 21. Each of the preceding matrices contributes to three units of dimension.

A 7*7 square matrix is said to verify the property $P_4$ if all its rows, all its columns and all its diagonals of gradient 1 are in the code $B_0$.

By examining the matrices associated with the polynomials of basis M, it is established that there are ten matrices of the basis M which verify the property $P_4$ namely $e_6$, $e_7$, $e_8$, $e_9$, $e_{10}$, $e_{12}$, $e_{13}$, $e_{14}$, $e_{15}$ and $e_{16}$. It can be demonstrated that the set of matrices verifying the property $P_4$ is an ideal of dimension 30. Each of the preceding matrices contributes to three units of dimension.

Using a particular example, a method of coding, information transmission, error correction and decoding using the ideal of the matrices of M which verify the property $P_1$ will now be explained.

It has been seen above that this ideal is of dimension ten. The binary sequence to be transmitted will therefore be broken down into blocks each comprising ten bits of information. These ten bits of information are represented by the ten-tuple of elements of the set $\{0, 1\}$; $w=(a_0, a_1, a_2, b_0, b_1, b_2, c_0, c_1, c_2, d_0)$.

In FIG. 1, the coding device is illustrated in block diagram form and shown by the general reference 10. It has, interconnected by an address and data bus 102:

- a central processing unit 106;
- a random access memory RAM 104;
- a read-only memory ROM 105;
- an input port 103 used to receive, in the form of binary data, information which the coding device has to transmit;
- an output port 107 successively receiving two sequences and simultaneously transmitting the pairs formed from their homologous elements to a modulator 109 which, from this sequence of pairs, produces a sequence of symbols of the alphabet of the transmission channel, here composed of a 64-state alphabet known by the name "64-QAM";

and, independently of the bus 102:

- a transmitter 110 having an ultrahigh frequency interface circuit which performs the transposition of the signal modulated by the modulator 109 to a carrier frequency and its amplification, and a transmitting antenna which broadcasts this transposed and amplified signal;
- a display screen 108 connected to the output port 107;
- a keyboard 101 connected to the input port 103 and supplying bytes representing successively used keyboard keys; and
- an input 111 of data to be transmitted, in the form of binary data, connected to the input port 103.

Each of the elements illustrated in FIG. 1 is well known to persons skilled in the art of transmission systems and, more generally, information processing systems. These elements are therefore not described here.

It should be noted here that the word "register" used below designates, in each of the memories, both a memory area of small capacity (storing only a few binary data items) and a memory area of large capacity (allowing a complete program to be stored).

The random access memory 104 stores data, variables and intermediate processing results, in memory registers having, in the remainder of the description, the same names as the data whose values they store. The random access memory 104 includes notably:

- a register "a(z)",
- a register "$v_1(x,y)$",
- a register "b(z)",
- a register "$v_1(x,y)$",
- a register "c(z)",
- a register "$v_3(xy)$",
- a register "c(z)",
- a register "$v_4(x,y)$" and
- a register "v(x,y)".

The random access memory 104 constitutes an information storage means readable by a computer or a microprocessor. It stores data resulting from the implementation of this method, that is to say coded data.

According to a variant, the random access memory 104 is removable, partially or totally, and includes, for example, a magnetic tape or a diskette.

The read-only memory 105 stores data in memory registers having, in the remainder of the description, the same names as the data whose values they store. The read-only memory includes notably:

the operating program of the central processing unit 106, in a register "coding program"; and the polynomials $e_0(x,y)$, $e_1(x,y)$, $e_3(x)y)$ and $e_{10}(x,y)$.

Figure 2:
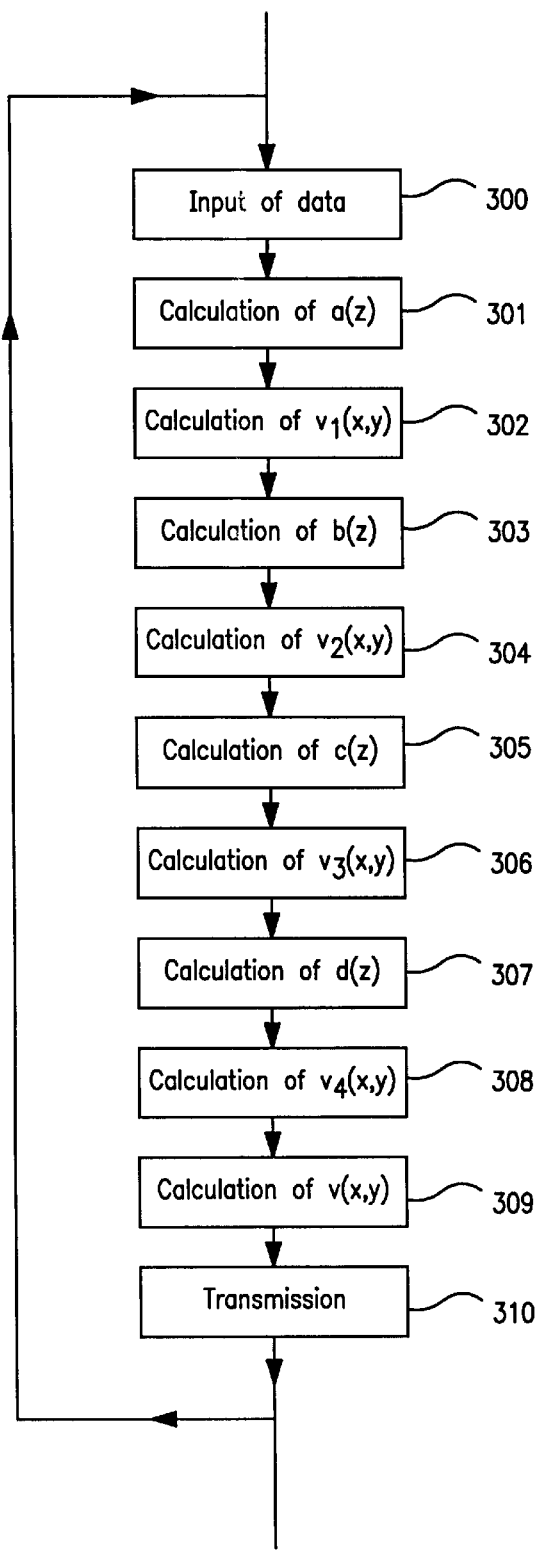
FIG. 2 depicts a flow diagram of the operation of the coding device illustrated in FIG. 1.

The central processing unit 106 is adapted to implement the flow diagram described in FIG. 2. In this FIG. 2, it may be seen that, following an initialization operation, not depicted, during an operation 300, the input of data into the transmitting device illustrated in FIG. 1 is performed: the ten-tuple w accesses the random access memory 104, passing through the input 111 and the input port 103.

Next, the coding commences.

It should be recalled that the elements of the basis M which verify the property $P_1$ are the matrices $e_0$, $e_1$, $e_3$ and $e_{10}$.

For the matrix $e_1$, on the one hand, it was specified that it contributes to three units of dimension, and, on the other hand, it should be noted that the diagonals of gradient one of the matrix e, are non-constant, that is to say that each diagonal of gradient one of the matrix e, contains both at least one "zero" and at least one "one" (other gradients also verify this property).

During an operation 301, the central unit 106 represents three bits of information to be transmitted by means of the coefficients of a polynomial $a(z)=a_0+a_1*z+a_2*z^2$ in a variable of degree two with binary coefficients (the degree of the polynomial a(z) corresponds to the number of units of dimension to which et contributes from which one is subtracted). The polynomial a(z) is stored in the register "a(z)" of the random access memory 104. Then, during an operation 302, the central unit 106 defines $v_1(x,y)$ a(x*y); $(x^1*y^1$ is chosen to be put in the polynomial a(z) since the diagonals of gradient one of the matrix $e_1$ are not constant; if a diagonal of non-infinite gradient m verifying the property of being non-constant had been considered, $x^m*y^1$ would have been chosen, and if a diagonal of infinite gradient m verifying the property of being nonconstant had been considered, x would have been chosen). The polynomial $v_1(x,y)$ is stored in the register "$v_1(x,y)$" of the random access memory 104.

During an operation 303, for the matrix $e_3$, in the same way, the central unit 106 defines a polynomial b(z) in a variable of degree two (since as previously, (the matrix $e_3$ contributes to three units of dimension): $b(z)=b_0+b_1*z+b_2*z^2$. The polynomial b(z) is stored in the register "b(z)" of the random access memory 104. Then, during an operation 304, the central unit 106 defines $v_2(x,y)=b(x*y)$ (since as previously the diagonals of gradient one of the matrix $e_3$ are not constant). The polynomial $v_2(x,y)$ is stored in the register "$v_2(x,y)$" of the random access memory 104.

During an operation 305, for the matrix $e_{10}$, in an analogous manner, a polynomial c(z) is defined in a variable of degree two (since as previously, the matrix $e_{10}$ contributes to three units of dimension): $c(z)=c_0+c_1*z+c_2*z^2$. The polynomial c(z) is stored in the register "c(z)" of the random access memory 104. Then, during an operation 306, the central unit 106 defines $v_3(x,y)=c(y)$; $(x^0*y^1$ is chosen to be put in the polynomial c(z) since the diagonals of gradient zero of the matrix $e_{10}$ are not constant). The polynomial $v_3(x,y)$ is stored in the register "$v_3(x,y)$" of the random access memory 104.

During an operation 307, for the matrix $e_0$, in an analogous manner, the central unit defines a polynomial d(z) in a variable of degree zero (since the matrix $e_0$ contributes to one unit of dimension): $d(z)=d_0$. d(z) is stored in the register "d(z)" of the random access memory 104. Then, during an operation 308, the central unit 106 defines $v_4(x,y)=d_0$. The polynomial $v_4(x,y)$ is stored in the register "$v_4(x,y)$" of the random access memory 104.

During an operation 309, the central unit calculates the polynomial:

$$v(x,y)=v_1(x,y)*e(x,y)+v_2(x,y)*e_3(x,y)+v_3(x,y)*e_{10}(x,y)+v_4(x,y)*e_0(x,y).$$

The polynomial v(x,y) is stored in the register "v(x,y)" of the random access memory 104. Once the coding has been carried out, the symbols $v_{i,j}$ of the polynomial v(x,y) are transmitted, during an operation 310, in any order known by the receiver.

Then the operation 300 is repeated

Figure 3:
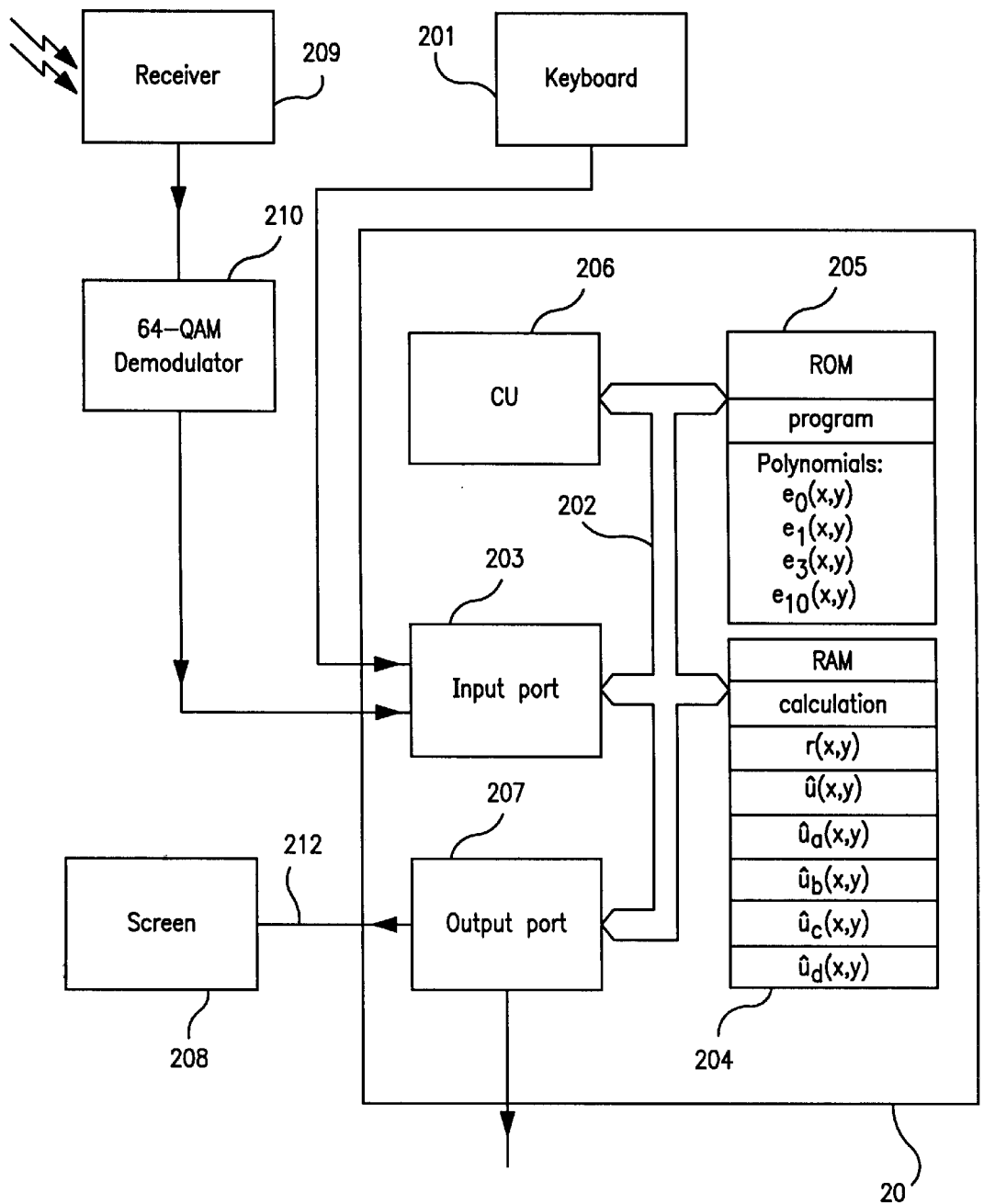
FIG. 3 depicts a correction and decoding device according to the present invention.

The correction and decoding device depicted in FIG. 3, under general reference 20, is illustrated in block diagram form. It has, interconnected by an address and data bus 202:

- a central processing unit 206;
- a random access memory RAM 204;
- a read-only memory ROM 205;
- an input port 203 used to receive information which the correction and decoding device has to process, store or transmit:
   - an output port 207 allowing the correction and decoding device to transmit sequences of decoded binary information symbols;
   - and, independently of the bus 202:
- a receiver 209 having a receiving antenna which receives a signal representing the signal sent by the transmitting antenna 110 of a coding device, and an ultrahigh frequency interface circuit which performs automatic gain control and transposition into baseband of the received signal;
- a demodulator 210, connected to the input port 203, performing a demodulation, in the form of two sequences of symbols representing sequences of symbols received by the receiver 209 and previously modulated by 64-state quadrature amplitude modulation by the device illustrated in FIG. 1;
- a display screen 208 connected to the output port 207; and
- a keyboard 201 connected to the input port 203.

It should be noted here that the demodulator 210 may supply either sequences of integer numbers in the case of the so-called "hard" demodulation, or sequences of any decimal numbers in the case of the so-called "soft" demodulation. Thus, depending on whether a hard or soft demodulation is carried out, the sequences of received symbols are respectively estimated as numbers of the alphabet used on the transmission channel or as numbers capable of taking a greater diversity of values, such as, for example, values of a probabilistic nature with regard to the transmitted signal.

Each of the elements illustrated in FIG. 3 is well known to persons skilled in the art of correction and information decoding systems and, more generally, information processing systems. These elements are therefore not described here.

The random access memory 204 stores data, variables and intermediate processing results, in memory registers having, in the remainder of the description, the same names as the data whose values they store. The random access memory 204 includes notably:

- a register "r(x,y)",
- a register "û(x,y)",
- a register "$û_a(x,y)$",
- a register "$û_b(x,y)$",
- a register "$û_c(x,y)$",
- a register "$û_d(x,y)$" and
- a register "calculation" in which a series of decoded binary data is stored, a series which is intended to be placed on the output port 207 The readily memory 205 stores data in memory registers having, in the remainder of the description, the same names as the data whose values they store The read-only memory 205 includes notably
- the operating program of the central processing unit 206, in a register "program"; and
- the polynomials $e_0(x,y)$, $e_1(x,y)$, $e_3(x,y)$ and $e_{10}(x,y)$.

The read-only memory 205 constitutes an information storage means readable by a computer or a microprocessor. It stores instructions of a computer program which allows the implementation of the correction and decoding method which is the object of the invention.

According to a variant, the read-only memory 205 is removable, partially or totally, and includes, for example, a magnetic tape, a diskette or a CD-ROM.

Figure 4:
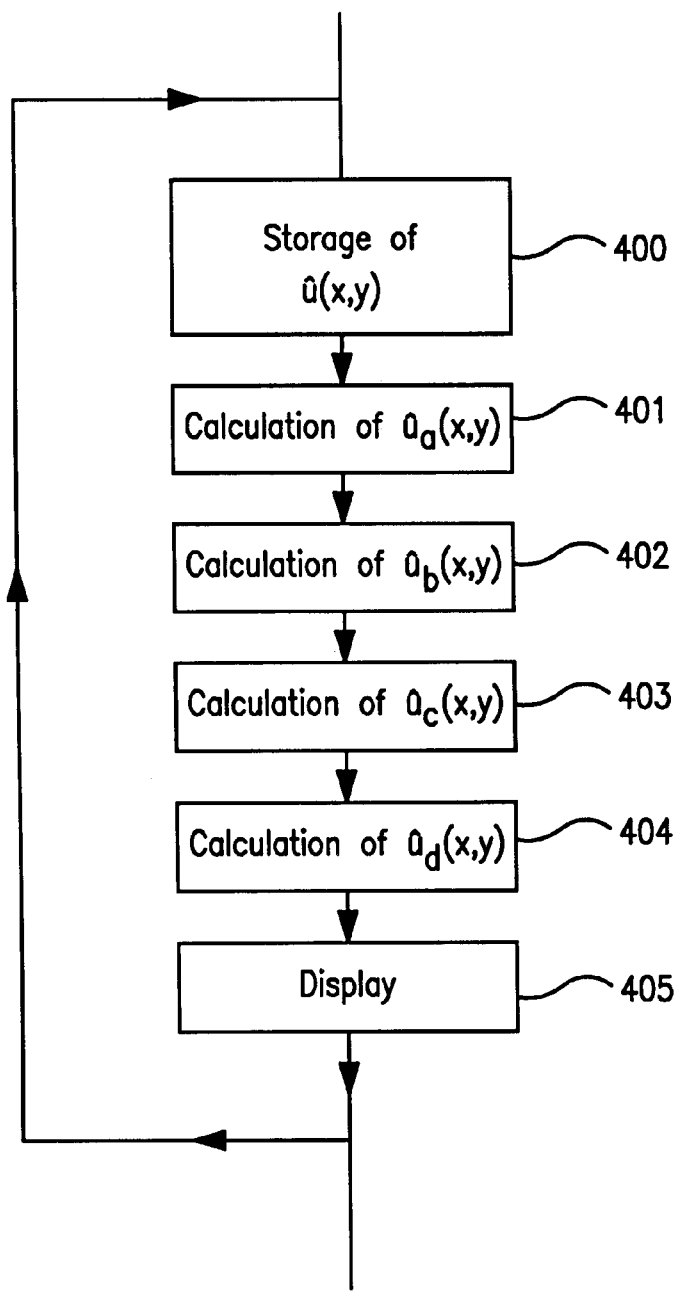
FIG. 4 depicts a flow diagram of the operation of the decoding device illustrated in FIG. 3.

The central processing unit 206 is adapted to implement the flow diagram described in FIG. 4. During an initialization operation, not depicted, the receiving device illustrated in FIG. 3 is initialized.

After demodulation of the corresponding received signal, the receiver has available a signal denoted r(x,y) which is stored in the register "r(x,y)" of the random access memory 204.

A description will now be given of the error correction and decoding performed in accordance with the invention, particularly adapted here to a channel close to a theoretical channel with Additive White Gaussian Noise.

We still consider the use of the same code of length 49 and dimension 10.

Each codeword is represented by a binary 7×7 matrix or by a polynomial:

$$v(x,y) = \sum_{i=0}^{6} \sum_{j=0}^{6} v_{i,j} x^i y^j$$

Let $$r(x,y) = \sum_{i=0}^{6} \sum_{j=0}^{6} r_{i,j} x^i y^j$$

be the polynomial representation of the 49 received $r_{i,j}$. These are numbers obtained under the action of the noise on the electrical signals that represent the transmitted $v_{i,j}$.

In the considered example codewords are such that all rows, all columns and all diagonals of slope 1 are codewords of the (7, 4) Hamming code, To decode r(x,y), one first constructs the 7×7 matrix $\mathfrak{J}$ having $\mathfrak{J}_{i,j}=\log[f(r_{i,j})]$ as (i,j) entry, for 0<ij<6. Then one applies the following iterative procedure.

Step 1: One works on the rows of $\mathfrak{J}$. For any pair of (i, j) indices, one computes from the corresponding six $\mathfrak{J}_{i,k}$, k≠j, the ratio between the probability that $v_{i,j}=1$ and the probability that $v_{i,j}0$. The logarithm of this ratio in any fixed base >1 is denoted by $\mathcal{J}_{i,j}$ and the 7×7 matrix of these $\mathcal{J}_{i,j}$ is denoted by $\mathcal{J}$. One sets K1=$\mathcal{J}$. This matrix K1 produced during the first decoding step is the matrix of extrinsic informations obtained during the first step.

Step 2: One works on the columns of the matrices $\mathfrak{J}$ and K1, which is now considered as a priori information for step 2. One sets: $\mathcal{L}=\mathfrak{J}+K1$.

For any pair of (i, j) indices, one computes from the six values $\mathcal{L}_{k,j}$, $k \neq i$, the ratio between the probability that $v_{i,j}=1$ and the probability that $v_{i,j}=0$. The logarithm of this ratio in any fixed base >1 is denoted by $\mathcal{I}_{i,j}$ and the 7×7 matrix of these $\mathcal{I}_{i,j}$ is denoted by $\mathcal{I}$. One sets K2=$\mathcal{I}$. This matrix K2 produced during the second decoding step is the matrix of extrinsic informations obtained during the second step.

Step 3: One works on the columns of the matrices $\mathfrak{I}$ and K2, which is now considered as a priori information for step 3. One sets: $\mathcal{L}$=$\mathfrak{I}$+K2.

For an y pair of (i,j) indices, one computes from the six values $\mathcal{L}_{i+k, j+k}$, k=1, . . . , 6, the ratio between the probability that $v_{i,j}=1$ and the probability that $v_{i,j}=0$. The logarithm of this ratio in any fixed base >1 is denoted by $\mathcal{I}_{i,j}$, and the 7×7 matrix of these $\mathcal{I}_{i,j}$ is denoted by $\mathcal{I}$, One sets k3=$\mathcal{I}$. This matrix k3 produced during the third decoding step is the matrix of extrinsic informations obtained during the third step.

More generally, we may describe step m for any m≧4.

Step m: From matrices $\mathfrak{I}$ and Km−1, one obtains a matrix $\mathcal{I}$ based either on the rows or columns or main diagonals of $\mathcal{L}$=$\mathfrak{I}$+Km−1, depending on the fact that the residue of m modulo 3 is equal either to 1 or 2 or 0. Finally, one sets Km=$\mathcal{I}$.

After having realized the chosen number s of steps, one computes $\mathcal{D}$=$\mathfrak{I}$+Ks+Ks−1+Ks−2

If $\mathcal{D}_{i,j}$ is $\geq 0$, $v_{i,j}$ is estimated as being 1, and if $\mathcal{D}_{i,j}$ is <0, $v_{i,j}$ is estimated as being 0.

Then, during an operation 400, the polynomial û(x,y) is stored in the register "û(x,y)" of the random access memory 204.

It is then a matter of performing the decoding of the polynomial û(x,y) in order to recover the transmitted information represented by the polynomials a(z), b(z), c(z) and d(z) mentioned above.

In order to estimate these polynomials, the following procedure is then carried out.

If the polynomial û(x,y) does not belong to the code, the polynomial û(x,y) is eliminated, since in this case, the error correction was certainly not effective.

Otherwise, the following operations are performed.

During an operation 401, $û_a(x,y)=û(x,y)*e_1(x,y)$ is calculated The polynomial $û_a(x,y)$ is then stored in the directory "$û_a(x,y)$" of the random access memory 204. The coefficient $a_2$ is then estimated by assigning to it any one of the values of the coefficients of the monomials $x^6 y^i$ for the integer index i between 0 and 6 in the polynomial $û_a(x,y)$; these seven coefficients are in fact necessarily equal. Likewise the coefficient $a_1$ is estimated by assigning to it any one of the values of the coefficients of the monomials $x^5 y^i$ for the integer index i between 0 and 6 in the polynomial $û_a(x,y)$ and the coefficient $a_0$ is estimated by assigning to it any one of the values obtained as being the sum of the coefficients of the monomials $x^4 y^i$ and $x^6 y^j$ taken modulo two, for any integer indices i and j between 0 and 6 in the polynomial $û_a(x,y)$. The indices $a_0 a_1$ and $a_2$ are stored in the register "calculation" of the random access memory 204.

During an operation 402, $û_b(x,y)=û_a(x,y)*e_3(x,y)$ is calculated. The polynomial $û_b(x,y)$ is then stored in the directory "$û_b(x,y)$" of the random access memory 204. The coefficient $b_2$ is then estimated by assigning to it any one of the values of the coefficients of the monomial $y^6 x^i$ for the integer index i between 0 and 6 in the polynomial $û_b(x,y)$; these seven coefficients are in fact necessarily equal. Likewise the coefficient $b_1$ is estimated by assigning to it any one of the values of the coefficients of the monomial $y^5 x^i$ for integer i between 0 and 6 in the polynomial $û_b(x,y)$ and the index $b_0$ is estimated by assigning to it any one of the values obtained as being the sum of the coefficients of the monomials $y^4 x^i$ and $y^6 x^j$ taken modulo two, for any integer indices i and j between 0 and 6 in the polynomial $û_b(x,y)$. The indices $b_0$ $b_1$ and $b_2$ are stored in the register "calculation" of the random access memory 204.

During an operation 403, $û_c(x,y)=û(x,y)*e_{10}(x,y)$ is calculated. The polynomial $û_c(x,y)$ is then stored in the directory "$û_c(x,y)$" of the random access memory 204. The index $c_2$ is then estimated by assigning to it any one of the values of the coefficients of the monomial $x^{6-i}y^i$ taken modulo $(x^7+1)$ for integer i between 0 and 6 in the polynomial $û_c(x,y)$; these seven coefficients are in fact necessarily equal. Likewise the index $c_1$ is estimated by assigning to it any one of the values of the coefficients of the monomial $x^{5-i}y^i$ taken modulo $(x^7+1)$ for integer i between 0 and 6 in the polynomial $û_c(x,y)$ and the index $c_0$ is estimated by assigning to it any one of the values obtained as being the sum taken modulo two of the coefficients of the monomials $x^{4-i}v^i$ and $x^{6-j}y^j$ taken modulo $(x^7+1)$ for any integer i and j between 0 and 6 in the polynomial $û_c(x,y)$ The indices $c_0$ $c_1$ and $c_2$ are stored in the register "calculation" of the random access memory 204.

During an operation 404, $û_d(x,y)=û(x,y)*e_0(x,y)$ is calculated. $û_d(x,y)$ is then stored in the directory "$û_d(x,y)$" of the random access memory 204. The coefficient $d_0$ is then estimated by assigning to it any one of the values of the coefficients of the polynomial $û_d(x,y)$; the forty-nine coefficients of the polynomial $û_d(x,y)$ are in fact necessarily equal. The coefficient $d_0$ is stored in the register "calculation" of the random access memory 204. Once the decoding has been carried out in this way, the elements $a_0$, $a_1$, $a_2$, $b_0$, $b_1$, $b_2$, $c_0$, $c_1$, $c_2$ and $d_0$ are displayed on the screen 208, during an operation 405.

Then the operation 400 is repeated.

The decoding method has just been fully described for the preceding particular example.

In general, with reference to FIG. 4, for the decoding. the following procedure is carried out.

According to a first variant, it is first assumed that the transmission quality criterion is the inverse of the likelihood of error after correction for a transmitted word v(x,y).

In this case, with no other precaution, the polynomial û(x,y) can be converted into a sequence of information symbols in the following manner. For each minimal idempotent e(x,y), which, given the code, can occur in the factorization of v(x,y), $û(x,y)*e(x,y)$ modulo $x^{NV}-1$ and $y^{NH}-1$ (here $N_H=N_V=7$) is calculated.

In view of the structure of the code, the result of this multiplication is given by the polynomial $a^{(e)}(x,y)*e(x,y)$, where the polynomial $a^{(e)}(x,y)$ is obtained by a polynomial $a^{(e)}(z)$ of low degree (it was seen in the example used that the degree was equal to 0 or 2), by setting $z=x^i y^j$ for a good choice of the indices i and j: these good choices are the pairs of indices (i,j) chosen so that the coefficients of $x^{i+t}y^{j+t}$ modulo $x^N-1$ and $y^N-1$ for integer t between 0 and N−1 are not all identical in e(x,y). Identification of the polynomial $a^{(e)}(z)$ is simple since the number of possible polynomials $a^{(e)}(z)$ is small. It may be made for example by means of a read-only memory by taking, in the example used, any bit of $û(x,y)*e(x,y)$ if e(x,y) is the idempotent $e_0(x,y)$ or three consecutive bits of a previously chosen diagonal of nonidentical symbols of û(x,y)*e(x,y) if e(x,y) is a minimal idempotent different from $e_0$(x,y). The coefficients of the set of polynomials $a^{(e)}(z)$ give the transmitted information again.

According to a second variant, it is now assumed that the chosen quality criterion is that of the likelihood of error per bit of information estimated. It is then important that particular precautions are taken at coder level, since it is then advantageous to choose a systematic coder, that is to say a coder which, at certain chosen places in the coded word, reproduces the information symbols without modifying them. The way of solving this problem has been studied by H. Imai and S. Sakata (see on this subject the article "*A theory of two dimensional cyclic codes*" by H. Imai, published in Information and Control, vol. 34, pp 1–21 in 1977, or the article "On determining the independent point set for doubly periodic arrays and encoding two-dimensional cyclic codes and their duals" by S. Sakata, published in IEEE Transactions on Information Theory, vol 27, pp 556–565 in 1981. Of course, if a systematic coder is used, the coding operation is a little more complex at least in theoretical terms. Conversely, the decoding operation is simplified, since the calculation of the information symbols from the coefficients of the polynomial û(x,y) is performed by simple reading and therefore no longer includes these operations 401 to 404 mentioned above.

In analogous example embodiments not explained here, the ideal of the matrices of the basis M which verify the property $P_2$ (respectively the property $P_3$ or the property $P_4$) are used. The example embodiment with the ideal of the matrices of the basis M which verify the property $P_1$ makes it possible to understand the coding and transmission method; in this example, ten bits of information can be transmitted with a message of forty-nine bits. The efficiency is increased by taking the ideal of the matrices of the basis M which verify the property $P_2$ (respectively the property $P_3$ or the property $P_4$).

The following example embodiments also make it possible to increase the efficiency. Thus, in an analogous manner, the case where $N_v = N_h = N = 31$ can be considered. The notations and conventions of the theoretical context are used again.

In particular, applying these notations, it is seen that the set E is an ideal of dimension 31*31=961.

The following functions are defined:

$$f(x) = 1 + (x^5 + x^{10} + x^{20} + x^9 + x^{18}) + (x^7 + x^{14} + x^{28} + x^{25} + x^{19}) + (x^{11} + x^{22} + x^{13} + x^{26} + x^{21})$$

and $$s(x) = \Sigma_{l=0 \text{ to } 30} x^{21})$$

and the following sets:

$$M_a = \{1, 3, 5, 7, 11, 15\}$$

and $$M_b = \{0, 1, 2, 3, \ldots 29, 30\}.$$

Polynomials of the type $f(x^a)*s(x^b y)$, with the element a belonging to the set $M_a$ and the element b belonging to the set $M_b$, are defined: there are 186 polynomials of this type Polynomials of the type $f(y^a)*s(x)$, with the element a belonging to the set M, are defined, there are 6 polynomials of this type.

In all, 192 different polynomials which are denoted by $e_l$, for l between 1 and 192 have been defined.

The polynomial $e_0(x,y) = s(x)*s(y)$, which is distinct from the preceding polynomials, is also defined. The 193 polynomials $e_l$ for the index l between 0 and 192 are the idempotent minimal polynomials of the set E. As specified in the theoretical part, they form a basis of the set E.

The code B is defined as being the (31, 26) HAMMING code and the code $B_0$ is defined by saying that a thirty-one-tuple of elements of the set $\{0, 1\}$ is in the code if the sum of the elements of the thirty-one-tuple taken module two is equal to zero.

The element r which is either equal to zero, or infinity or an integer prime with 31 is considered and a 31*31 square matrix is said to verify the property $P_r$ if all its diagonals of gradient r are in the code B. It may be demonstrated that the set of matrices verifying the property $P_r$ is an ideal, and this ideal is denoted $C_r$.

By using a simple computer program which runs through the set of matrices, it may be verified that: if the element r is of the form $5*2^t$ or $11*2^t$, then the dimension $k_r$ of the ideal $C_r$ is equal to 571. If the element r is not of the preceding form, the dimension $k_r$ of the ideal $C_r$ is at most equal to 566.

Where the element r is of the form $5*2^t$ or $11*2^t$, the ideal $C_r$ is generated by 115 polynomials: the polynomial $e_0(x,y)$ and 114 of them are of the type $f(x^a)*s(x^b y)$, with a belonging to the set $M_a$ and b belonging to the set $M_b$ or of the type $f(y^a)*s(x)$, with a belonging to the set $M_a$. The polynomial $e_0(x,y)$ contributes to one unit of the dimension of the ideal $C_r$. The other 114 polynomials each contribute to five units of the dimension of the ideal $C_r$ and thus the dimension $571 = 5*114 + 1$ is correctly regained.

Let this be explained in an example, taking r=5: $k_5$ is equal to 571. Table I below lists the 114 distinct polynomials other than the polynomial $e_0(x,y)$, giving either the element pair a, b, or the singleton a making it possible to define, the polynomials of the types introduced previously.

TABLE I a = 3 and b belongs to {0, 1, 3, 4, 5, 6, 8, 9, 10, 11, 13, 15, 16, 17, 18, 20, 21, 22, 23, 26, 27, 29};
a = 5 and b belongs to {1, 2, 3, 4, 5, 6, 7, 8, 9, 10, 12, 14, 15, 17, 19, 20, 23, 24, 25, 28, 29, 30};
a = 7 and b belongs to {0, 1, 2, 4, 5, 7, 9, 10, 13, 14, 15, 16, 18, 19, 20, 21, 23, 25, 26, 27, 30};
a = 11 and b belongs to {0, 1, 2, 3, 4, 6, 7, 8, 11, 12, 13, 16, 17, 19, 21, 22, 24, 26, 27, 28, 29, 30};
a = 15 and b belongs to {0, 3, 5, 10, 11, 12, 14, 15, 17, 18, 19, 20, 22, 23, 24, 25, 26, 27, 28, 29, 30};
a belongs to {3, 5, 7, 11, 15}.

Two distinct elements $r_1$ and $r_2$ are considered: the element $r_1$ (respectively the element $r_2$) is either equal to zero or infinity, or an integer prime with 31 and a 31*31 square matrix is said to verify the property $P_{r1,r2}$ if all its diagonals of gradient $r_1$ or $r_2$ are in the code B. It may be demonstrated that the set of matrices verifying the property $P_{r1,r2}$ is an ideal, and this ideal is denoted $C_{r1, r2}$.

By again using a simple computer program which runs through the set of matrices, the following proposition is verified: the dimension of an ideal of the form $C_{r1,r2}$ is at most 486 and there exist ideals of the form $C_{r1,r2}$ of dimension 486.

Let $r_1$ and $r_2$ be integers defined as previously and such that the ideal $C_{r1,r2}$ is of dimension 486. This ideal is generated by 97 polynomials: the polynomial $e_0(x,y)$ and 97 distinct polynomials of the type $f(x^a)*s(x^b y)$, with the element a belonging to the set $M_a$ and the element b belonging to the set $M_b$ or of the type $f(y^a)*s(x)$, with the element a belonging to the set $M_a$. The polynomial $e_0(x,y)$ contributes to one degree of the dimension of the ideal $C_{r1,r2}$. The other 97 polynomials each contribute to five units of the dimension of the ideal $C_{r1,r2}$ and thus the dimension $486=5*97+1$ is correctly regained.

Let this be explained in an example, taking $r_1=5$ and $r_2=10$. Table II below lists the 97 polynomials other than the polynomial $e_0(x,y)$, giving either the element pair a, b, or the singleton a making it possible to define the polynomials of the types introduced previously.

TABLE II a = 3 and b belongs to {0, 1, 3, 5, 6, 8, 9, 10, 11, 13, 15, 16, 18, 20, 21, 22, 23, 26, 27};
a = 5 and b belongs to {2, 3, 4, 6, 7, 8, 9, 10, 12, 14, 15, 17, 19, 20, 24, 25, 28, 29, 30};
a = 7 and b belongs to {0, 1, 2, 4, 5, 7, 9, 10, 14, 15, 18, 19, 20, 21, 23, 25, 26, 28, 30};
a = 11 and b belongs to {0, 1, 2, 3, 4, 6, 7, 8, 11, 12, 13, 16, 17, 21, 22, 24, 26, 27, 29};
a = 15 and b belongs to (0, 3, 5, 10, 15, 17, 19, 20, 22, 23, 24, 25, 27, 28, 29, 30};
a belongs to {3, 5, 7, 11, 15}.

Three elements $r_1$, $r_2$ and $r_3$ distinct in pairs are now considered; $r_1$ (respectively $r_2$ and $r_3$) is either equal to zero or infinity or is an integer prime with 31. A 31*31 square matrix is said to verify the property $P_{r1,r2,r3}$ if all its diagonals of gradient $r_1$ or $r_2$ or $r_3$ are in the code B. It may be demonstrated that the set of matrices verifying the property $P_{r1,r2,r3}$ is an ideal, and this ideal is denoted $C_{r1,r2,r3}$.

By again using a simple computer program which mns through the set of matrices, the following proposition is verified: the dimension of an ideal of the form $C_{r1,r2,r3}$ is at most 411 and there exist ideals of the form $C_{r1,r2,r3}$ of dimension 411.

Let $r_1$, $r_2$ and $r_3$ be integers defined as previously and such that the ideal $C_{r1,r2,r3}$ is of dimension 411. This ideal is generated by 82 polynomials: the polynomial $e_0(x,y)$ and 82 distinct polynomials of the type $f(x^a)*s(x^b y)$, with the element a belonging to the set $M_a$ and the element b belonging to the set $M_b$ or of the type $f(y^a)*s(x)$, with the element a belonging to the set $M_a$. The polynomial $e_0(x,y)$ contributes to one unit of the dimension of $C_{r1,r2,r3}$. The other 82 polynomials each contribute to five units of the dimension of $C_{r1,r2,r3}$ and thus the dimension $411=5*82+1$ is correctly regained.

Let this be explained in an example, taking $r_1=1$, $r_2=10$ and $r_3=21$. Table III below lists the 82 polynomials other than the polynomial $e_0(x,y)$, giving either the element pair a, b, or the singleton a making it possible to define the polynomials of the types introduced previously.

TABLE III a = 3 and b belongs to {0, 1, 2, 3, 5, 6, 10, 11, 12, 13, 16, 21, 22, 23, 27, 30};
a = 5 and b belongs to {2, 4, 6, 7, 8, 9, 10, 15, 17, 18, 19, 20, 24, 25, 28, 29, 30};
a = 7 and b belongs to {0, 1, 5, 8, 9, 10, 11, 15, 19, 20, 21, 23, 26, 28, 29, 30};
a = 11 and b belongs to {1, 2, 3, 4, 7, 12, 13, 14, 16, 17, 22, 23, 24, 25, 27, 29};
a = 15 and b belongs to {0, 7, 10, 13, 15, 19, 20, 21, 24, 27, 28, 30};
a belongs to {3, 5, 7, 11, 15}.

Four elements $r_1$, $r_2$, $r_3$ and $r_4$ distinct in pairs are now considered: $r_1$ (respectively $r_2$, $r_3$ and $r_4$) is either equal to zero or infinite or is an integer prime with 31. A 31*31 square matrix is said to verify the property $P_{r1,r2,r3,r4}$ if all its diagonals of gradient $r_1$ or $r_2$ or $r_3$ or $r_4$ are in the code B. It may be demonstrated that the set of matrices verifying the property $P_{r1,r2,r3,r4}$ is an ideal, and this ideal is denoted $C_{r1,r2,r3,r4}$.

By again using a simple computer program which runs through the set of matrices, the following proposition is verified: the dimension of an ideal of the form $C_{r1,r2,r3,r4}$ is at most 346 and there exist ideals of the form $C_{r1,r2,r3,r4}$ of dimension 346.

Let $r_1$, $r_2$, $r_3$ and $r_4$ be integers defined as previously and such that the ideal $C_{r1,r2,r3,r4}$ is of dimension 346. This ideal is generated by 70 polynomials: the polynomial $e_0(x,y)$ and 69 distinct polynomials of the type $f(x^a)*s(x^b y)$, with the element a belonging to the set $M_a$ and the element b belonging to the set $M_b$ or of the type $f(y^a)*s(x)$, with the element a belonging to the set $M_a$. The polynomial $e_0(x,y)$ contributes to one unit of the dimension of the set $C_{r1,r2,r3,r4}$. The other 69 polynomials each contribute to five units of the dimension of $C_{r1,r2,r3,r4}$ and thus the dimension $346=5*69+1$ is correctly regained.

Let this be explained in an example, taking $r_1=1$, $r_2=5$, $r_3=10$ and $r_4=18$. Table IV below lists the 69 polynomials other than the polynomial $e_0(x,y)$, giving either the element pair a, b, or the singleton a making it possible to define the polynomials of the types introduced previously.

TABLE IV a = 3 and b belongs to {0, 3, 5, 9, 10, 11, 13, 16, 18, 21, 22, 23, 27};
a = 5 and b belongs to {2, 3, 4, 6, 7, 10, 15, 17, 19, 20, 24, 25, 28, 30};
a = 7 and b belongs to {0, 1, 2, 5, 9, 10, 14, 15, 19, 20, 23, 26, 28};
a = 11 and b belongs to {0, 1, 2, 3, 4, 8 12, 13, 16, 17, 22, 24, 26, 29};
a = 15 and b belongs to {0, 10, 15, 23, 24, 25, 27, 28, 29, 30};
a belongs to {3, 5, 7, 11, 15}.

Using the ideal $C_{r1}$ (respectively $C_{r1,r2}$, $C_{r1,r2,r3}$ or $C_{r1,r2,r3,r4}$), coding and transmission methods are implemented which are analogous to that explained for the example embodiment which uses the ideal of the matrices of the basis M which verify the property $P_1$ in the case $N_h=N_v=N=7$. All these example embodiments are of course given by way of non-limitative illustration of the coding and transmission method according to the invention.

It should be noted here that, for m greater than or equal to three, there exist a number of equivalent and cyclic Hamming codes, denoted $B_h$, with h equal to one, two, etc, of length n equal to $2^m-1$ and of dimension k equal to n−m. Each of them corresponds to a different so-called primitive generator polynomial of degree m (see for example the book by W. W. Peterson, "Error correcting codes", MIT Press, 1961). In the constructions described above, the same Hamming code denoted B was used for all the gradients $r_i$. According to a variant, this constraint is not applied and different Hamming codes $B_h$ are chosen for the different gradients $r_i$. More generally, the method described above lends itself to the construction of codes, the words of which are N*N tables such that for u a fixed integer and for each integer i between 1 and u, a gradient $r_i$ is specified such that all the diagonals of gradient $r_i$ of the word are in a cyclic code $B_i$ of length N.

All these coding systems, as far as they are coupled with the corresponding decodings described above, form part of the present invention and persons skilled in the art will implement them easily.

What is claimed is:

1. Method of transmitting information representing a physical quantity and represented by first binary symbols, having:

a coding operation comprising an operation of calculating second binary symbols, referred to as calculated binary symbols, from the information, the calculated binary symbols being provided in order to be disposed in a square table, an operation of transferring the calculated binary symbols, comprising an operation of modulating the calculated binary symbols and an operation of demodulating the modulated symbols into symbols referred to as received symbols, an operation of correcting the received symbols, thus providing corrected symbols, and an operation of decoding the information from the corrected symbols, characterised in that, for each calculated binary symbol, there exist at least three distinct diagonals in the table which contain this calculated binary symbol and which, deprived of this calculated binary symbol, still allow each one on its own to recalculate the calculated binary symbol, the demodulating operation is performed by a soft decision method, and the correcting operation is performed iteratively with respect to each of the distinct diagonals.

2. Method according to claim 1, wherein the calculating operation comprises:

an operation of defining a plurality of bivariable information polynomials representing the first binary symbols as their coefficients, and an operation of calculating the calculated binary symbols in the form of coefficients of a polynomial obtained as a sum of products of each one of the information polynomials and a respective one of a plurality of predetermined basis polynomials which form a basis of the set of all bivariable polynomials.

3. Method according to claim 2, wherein the decoding operation comprises:

an operation of calculating product polynomials by multiplying a polynomial representing the corrected symbols and each of the predetermined basis polynomials, an operation of estimating the first binary symbols as the coefficients of the information polynomials by using specific coefficients of the product polynomials, and an operation of outputting the estimated coefficients as the decoded information.

4. Method according to claim 1, wherein the correcting operation determines a respective log-likelihood-ratio and the corrected symbols are estimated on the basis of a sum of the respective log-likelihood-ratios.

5. Method according to claim 1, wherein, during the calculation operation, there exists an Abelian code such that, for any information, the table of calculated binary symbols is a word of the Abelian code.

6. Method according to claim 1, wherein there exists an integer n greater than or equal to two, such that, during the calculation operation, for an element r which is null or infinite or an integer prime with n, each diagonal of gradient r is a word of a BCH code.

7. Method according to claim 1, wherein there exists an integer m greater than or equal to 2, an integer n equal to $2^m-1$ and an integer k equal to n−m, such that, during the calculation operation, for an element $P_e$ which is null or infinite or an integer prime with the integer n, each diagonal of gradient $P_e$ is a word of a Hamming code of type (n, k).

8. Method according to claim 1, wherein there exists an integer m greater than or equal to 2, an integer n equal to $2^m-1$ and an integer k equal to n−m, such that, during the calculation operation, for at least two elements p and q, with p null or infinite or an integer prime with the integer n and q null or infinite or an integer prime with the integer n, each diagonal of gradient p and each diagonal of gradient q is a word of one and the same Hamming code of type (n, k).

9. Method according to claim 1, wherein there exists at least one integer n greater than or equal to two, such that, during the calculation operation, for an element s which is null or infinite or an integer prime with the integer n, each diagonal of gradient s is a word of the parity code of type (n, n−1).

10. Device of storing information which can be read by a computer or microprocessor storing instructions of a computer program, characterised in that it permits the implementation of the method according to claim 1.

11. Device according to claim 10, characterised in that it can be removed partially or totally.

12. A method according to claim 1, wherein said correcting operation is performed by a soft decision method.

13. Device for transmitting information representing a physical quantity and represented by first binary symbols, having:

coding means comprising means of calculating second binary symbols, referred to as calculated binary symbols, from the information, the calculated binary symbols being provided in order to be disposed in a square table, means of transferring the said calculated binary symbols, comprising means of modulating the calculated binary symbols, and means of demodulating the modulated symbols into symbols referred to as received symbols, means of correcting the received symbols, thus providing corrected symbols, and means of decoding the information from the corrected symbols, characterised in that, the calculation means is adapted so that, for each calculated binary symbol, there exist at least three distinct diagonals in the table which contain this calculated binary symbol, and which still allow each one on its own to recalculate the calculated binary symbol, the demodulating means is adapted to implement a soft decision method, and the correcting means is adapted to implement a soft decision method, and the correcting means is adapted to implement an iterative correcting method with respect to each of the distinct diagonals.

14. Device according to claim 13, wherein the calculating means comprises:

means of defining a plurality of bivariable information polynomials representing the first binary symbols as their coefficients, and means of calculating the calculated binary symbols in the form of coefficients of a polynomial obtained as a sum of products of each one of the information polynomials and a respective one of a plurality of predetermined basis polynomials which form a basis of the set of all bivariable polynomials.

15. Device according to claim 14, wherein the decoding means comprises:
- means of calculating product polynomials by multiplying a polynomial representing the corrected symbols and each of the predetermined basis polynomials,
- means of estimating the first binary symbols as the coefficients of the information polynomials by using specific coefficients of the product polynomials, and
- means of outputting the estimated coefficients as the decoded information.

16. Device according to claim 13, wherein the decoding means is adapted to determine a respective log-likelihood-ratio and estimate the corrected symbols on the basis of a sum of the respective log-likehood-ratios.

17. Device according to claim 13, wherein there exists an Abelian code such that, for any information, the table of calculated binary symbols is a word of the Abelian code.

18. Device according to claim 13, wherein there exists an integer n greater than or equal to two, such that for an element r which is null or infinite or an integer prime with n, each diagonal of gradient r is a word of a BCH code.

19. Device according to claim 13, wherein there exists an integer m greater than or equal to 2, an integer n equal to $2^m-1$ and an integer k equal to n−m, such that, for an element $p_e$ which is null or infinite or an integer prime with the integer n, each diagonal of gradient $p_e$ is a word of a Hamming code of type (n, k).

20. Device according to claim 13, wherein there exists an integer m greater than or equal to 2, an integer n equal to $2^m-1$ and an integer k equal to n−m, such that, for at least two elements p and q, with p null or infinite or an integer prime with the integer n and q null or infinite or an integer prime with the integer n, each diagonal of gradient p and each diagonal of gradient q is a word of one and the same Hamming code of type (n, k).

21. Device according to claim 13, wherein there exists an integer n greater than or equal to two such that, for an element s which is null or infinite or an integer prime with the integer n, each diagonal of gradient s is a word of the parity code of type (n, n−1).

22. Camera, characterised in that it includes a device according to claim 13.

23. Facsimile machine, characterised in that it includes a device according to claim 13.

24. Photographic apparatus, characterised in that it includes a device according to claim 13.

25. Computer, characterised in that it includes a device according to claim 13.

* * * * *

UNITED STATES PATENT AND TRADEMARK OFFICE
CERTIFICATE OF CORRECTION

PATENT NO. : 6,543,021 B1
DATED : April 1, 2003
INVENTOR(S) : Philippe Piret

It is certified that error appears in the above-identified patent and that said Letters Patent is hereby corrected as shown below:

Column 1,
Line 45, "$v_i$" should read -- v --.

Column 2,
Line 36, "rand" should read -- r and --.

Column 4,
Line 9, "an" should read -- can --.

Column 5,
Line 55, "are" should read -- is --.

Column 7,
Line 50, "is." should read -- 1s. --.

Column 9,
Line 10, "these" should read -- there --; and
Line 21, "g(x,y)+g(x,y)=g(x,y)." should read -- g(x,y)*g(x,y)=g(x,y). --.

Column 12,
Line 2, "$e_l$(xJy)" should read -- $e_l$(x,y) --;
Line 9, "matrix M" should read -- basis M --; and
Line 39, "dimension" should read -- dimension. --.

Column 13,
Line 50, ""$v_1$(x,y)"," should read -- "$v_2$(x,y)", --.

Column 14,
Line 3, "$e_3$(x)y)" should read -- $e_3$(x,y) --; and
Line 26, "et" should read -- $e_1$ --.

Column 15,
Line 4, "e(x,y)" should read -- $e_1$(x,y) --.

Column 16,
Line 3, "port 207 The" should read -- port 207. ¶ The --;
Line 6, "store" should read -- store. --;
Line 7, "notably" should read -- notably: --;
Line 54, "0<ij<6." should read -- $0 \leq i,j \leq 6$. --;
Line 59, "$v_{i,j}$0." should read -- $v_{i,j}=0$ --; and
Line 64, "informations" should read -- information --.

UNITED STATES PATENT AND TRADEMARK OFFICE
CERTIFICATE OF CORRECTION

PATENT NO. : 6,543,021 B1
DATED : April 1, 2003
INVENTOR(S) : Philippe Piret

It is certified that error appears in the above-identified patent and that said Letters Patent is hereby corrected as shown below:

Column 17,
Line 8, "informations" should read -- information --; and
Line 12, "an y" should read -- any --.

Column 19,
Line 51, "$x^{21}$)" should read -- $x^i$ --; and
Line 64, "type" should read -- type. --.

Column 21,
Line 33, "mns" should read -- runs --; and
Line 34, "8" should read -- 8, --.

Column 23,
Line 20, "characterised" should read -- characterized --.

Column 24,
Lines 20, 22 and 42, "characterised" should read -- characterized --.

Column 26,
Lines 16, 18, 20 and 22, "characterised" should read -- characterized --.

Signed and Sealed this

Eighteenth Day of November, 2003

JAMES E. ROGAN
*Director of the United States Patent and Trademark Office*